INVENTOR
M. UENOHARA
BY
Lyman Sherman
ATTORNEY

United States Patent Office 3,253,227

Patented May 24, 1966

3,253,227

ELECTRONICALLY TUNABLE IDLER CIRCUIT FOR VARYING SIGNAL PARAMETRIC AMPLIFIER

Michiyuki Uenohara, Murray Hill, N.J., assignor to Bell Telephone Laboratories, Incorporated, New York, N.Y., a corporation of New York Filed Feb. 26, 1963, Ser. No. 261,023
8 Claims. (Cl. 330—4.8)

This invention relates to electromagnetic solid state devices and, in particular, to electronically tuned parametric amplifiers.

Because of its reliability, simplicity and favorable operating characteristics, the parametric amplifier now enjoys a preferred position among low-noise microwave amplifiers. One class of parametric amplifier utilizes the nonlinear capacitance of a diode as the active element. In such an amplifier, the diode is suitably disposed within a wave path and, under proper conditions, converts energy from a high frequency pump wave to a suitably related lower frequency signal. The operation of this type of amplifier is described by E. D. Reed in an article, entitled "The Variable-Capacitance Parametric Amplifier," published in the October 1959 Bell Laboratories Record, vol. 37, No. 10, pp. 373–379. (Also see "A Survey of Varactor Diode Parametric Amplifier Characteristics," by C. Freed in the January 1963 issue of The Microwave Journal.)

With existing techniques and diodes, however, it is very difficult to build an extremely low-noise microwave parametric amplifier that is also broadband. Whereas low-noise operation requires a high idler frequency, the natural resonant frequency of currently available diodes places an upper limit on what can be readily obtained in a simple circuit configuration. This necessitates more elaborate circuitry which, in turn, tends to limit the useful bandwidth of the idler circuit.

In order to increase the useful bandwidth of nondegenerate parametric amplifiers, it is proposed to tune the center frequency of the idler resonant circuit in accordance with the signal. To be of any practical use, however, such as in a receiver to be used in a frequency jumping radar, it is necessary that such tuning be done rapidly and accurately.

It is, accordingly, an object of this invention to rapidly tune a parametric amplifier by changing the center frequency of the idler resonant circuit.

It is a more specific object of the invention to tune the idler circuit of a parametric amplifier electronically.

In accordance with the invention, the idler resonant circuit of a parametric amplifier is tuned by the inclusion of a variable reactance, such as a variable-capacitance (varactor) diode, in the idler circuit. Since the equivalent capacitance of a varactor diode varies as a function of the diode bias, tuning can be readily effected by varying the diode bias. In particular, these variations can be programmed to follow variations in the frequency of the signal transmitted as, for example, by a radar.

Recognizing that it is difficult to "lock" precisely the idler tuning to the signal frequency, means are provided to minimize this error by increasing the instantaneous bandwidth of the amplifier beyond some specified error limit by superposing a small modulating signal on the idler tuning bias.

In an illustrative embodiment of the invention, the amplifier comprises a pair of diode mounts. One is a typical, nondegenerate amplifier mount including a resonant pump cavity, and a fixed-tuned idler cavity into which the signal to be amplified is coupled. The signal circuit is broadly tuned so as to accommodate the anticipated range of operation. The second, or external, diode mount is located in a variably-tuned idler circuit. The two idler circuits are separately adjustable and coupled through an appropriate length of transmission line.

The second idler tuning cavity is designed to present a short circuit at the pumping frequency so as not to interfere with pump matching. The bias voltage to the amplifier diode is maintained constant whereas the bias applied to the idler tuning diode is adjustable and, in addition, can be modulated.

These and other objects and advantages, the nature of the present invention and its various features, will appear more fully upon consideration of the illustrative embodiment now to be described in detail in connection with the accompanying drawings, in which:

FIG. 1, given for purposes of explanation, shows a simplified equivalent circuit of a nondegenerate parametric amplifier;

FIG. 2, given for purposes of explanation, shows an electronically tunable idler circuit and its simplified equivalent circuit;

Figure 1:
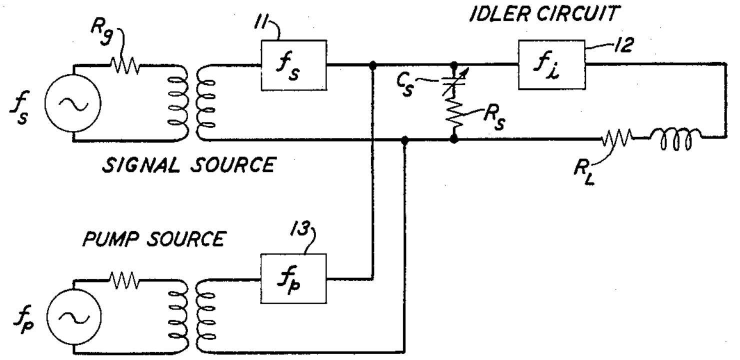

FIG. 1, included for purposes of explanation, shows a simplified equivalent circuit of a nondegenerate parametric amplifier. In the figure, the varactor diode, represented by its equivalent impedance $C_s$ and $R_s$, is coupled to an idler circuit, a signal circuit and a pump circuit. Blocks 11, 12 and 13 are bandpass filters which only pass the designated frequency bands.

The gain of the amplifier, with fixed passive circuits, is given by the following equation:

$$G=\frac{\left|(R_g+R_s)\left(1-jQ_s\frac{2\Delta f_s}{f_{so}}\right)-2R_s+\dfrac{\tilde{Q}_s\tilde{Q}_iR_s^2}{(R_L+R_s)\left(1+jQ_i\frac{2\Delta f_i}{f_{io}}\right)}\right|}{\left|(R_g+R_s)\left(1+jQ_s\frac{2\Delta f_s}{f_{so}}\right)-\dfrac{\tilde{Q}_s\tilde{Q}_iR_s^2}{(R_L+R_S)\left(1+jQ_i\frac{2\Delta f_i}{f_{io}}\right)}\right|} \quad (1)$$

where:

$Q_i$ and $Q_s$ are the loaded Q's of the idler and signal circuits, respectively, $Q_i$ and $Q_s$ are the dynamic quality factors of the idler circuit and the signal circuit, respectively, $f_{io}$ and $f_{so}$ are the center frequencies of the idler and signal circuits, respectively, and $\Delta f_s$ and $\Delta f_i$ represent the deviation of the signal frequency ($f_s$) and of the idler frequency ($f_p - f_s$) from $f_{so}$ and $f_{io}$, respectively.

For a low noise amplifier, $Q_i$ is necessarily much larger than $Q_s$ and, hence, the gain variation is primarily determined by the variation in the second term of the denominator. It follows that maximum gain is obtained at that signal frequency for which the corresponding idler frequency is $f_{io}$, i.e., $f_s = f_p - f_{io}$. It further follows that the signal frequency at which the gain is a maximum is automatically changed by changing $f_{io}$. This is the principle of "idler tuning."

Figure 2:
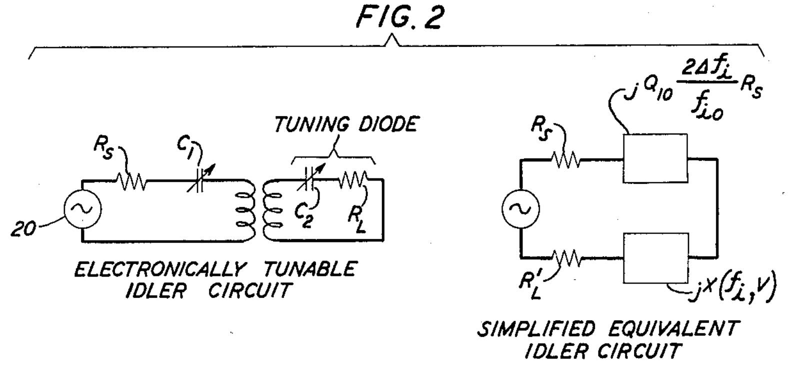

In accordance with the invention, the idler circuit is electronically tuned by coupling to a fixed-tuned idler circuit an external, variably-tuned idler circuit which includes, as the tunable element, a variable reactance such as a varactor diode. FIG. 2, given for purposes of explanation, shows an electronically tunable idler circuit and its simplified equivalent circuit.

In FIG. 2, generator 20 represents an equivalent idler generator source resulting from the interaction of the pump and the signal frequencies. $Q_{io}$ is the unloaded Q of the fixed-tuned idler circuit and $f_{io}$ is its resonant frequency. The term $jX(f_i, V)$ is the reactance component of the external idler tuning circuit and is a function of the idler frequency and the tuning voltage (diode bias) V.

The total idler impedance Z is given by $$Z=(R_s+R_L')+j\left\{Q_{io}\frac{2\Delta f}{f_{io}}+X(f_i, V)\right\} \qquad (2)$$

where $R_s$ and $R_L'$ are essentially the equivalent resistances of the amplifier diode and the tuning diode, respectively.

If the tuning voltage V is adjusted so as to satisfy the relation $$Q_{io}\frac{2\Delta f}{f_{io}}+X(f_i, V)=0 \qquad (3)$$

$Z_L$ is always real and equal to $(R_s+R_L')$.

For the simplest case $$Q_{io}\frac{2\Delta f}{f_{io}}R_s=\left\{\omega_i L_1-\frac{1}{\omega_i C_1}\right\} \qquad (4)$$

and $$X(f_i, V)=\left(\omega_i n^2 L_2-\frac{n^2}{\omega_i C_2}\right) \qquad (5)$$

where:

$L_1$ is the equivalent inductance of the fixed-tuned idler circuit,
$C_1$ is the equivalent capacitance of the fixed-tuned idler circuit,
$n$ is the circuit impedance transformation ratio,
$L_2$ is the equivalent inductance of the external idler circuit, and
$C_2$ is the equivalent capacitance of the external idler circuit.

Substituting (4) and (5) in (3), the condition to be satisfied over the tuning band of interest is given by $$\left(\omega_i L_1-\frac{1}{\omega_i C_1}\right)+n^2\left(\omega_i L_2-\frac{1}{\omega_i C_2}\right)=0 \qquad (6)$$

It will be noted that the larger $n^2$ is, and the larger the range over which $C_2$ can be varied, the wider is the band over which tuning can be achieved. However, the value of $n^2$ is limited by noise consideration. Preferably the ratio $$\frac{R_L'}{R_S}=\frac{n^2 R_L}{R_S} \qquad (7)$$

should be as small as possible for low noise operation. Accordingly, a high dynamic quality diode is advantageously used in order to obtain a wide tuning range. Also the circuit losses and pump leakage are preferably minimized. In addition, in any preferred embodiment, pump power is excluded from the tuning cavity to minimize any possibility of a change, during operation, in the level of the pumping power level applied to the amplifier diode.

Recognizing the practical difficulty in exactly synchronizing the idler tuning to the signal frequency, means can be provided to increase the instantaneous bandwidth of the amplifier beyond a prescribed error limit. Thus, if the amplifier does not have sufficient bandwidth to cover the anticipated error, the effective bandwidth is increased by superposing a small modulating signal on the idler tuning bias.

Figure 3:
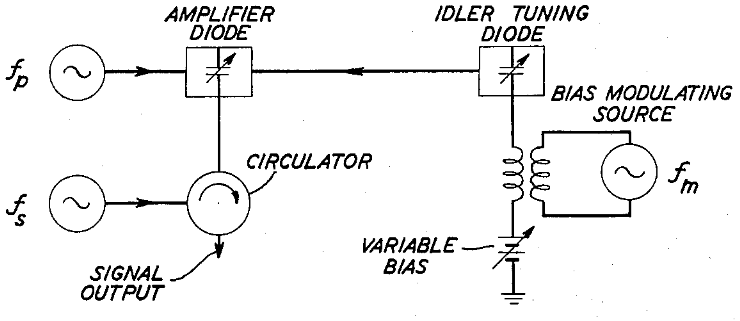
FIG. 3 shows a block diagram of an electronically tunable parametric amplifier including a modulating signal superposed upon the idler tuning diode.

FIG. 3 shows a block diagram of an electronically tunable parametric amplifier including a modulating signal superposed upon the idler tuning diode.

It should be noted that the only theoretical limitations on the rate at which the bias can be varied is the time constant of the tuning diode. This, typically, is very high. As a practical matter, however, the tuning rate is determined by the rate at which the transmitter frequency is changed and this would generally be much lower than this theoretical limit.

Similarly, the bias modulating frequency can be very high. Preferably, however, it should be lower than the idler frequency.

The amplitude of the bias modulating signal is a function of the anticipated error and the instantaneous bandwidth of the idler circuit. Since increasing the modulating amplitude tends to lower the amplifier gain, the preferred amplitude is selected to be as small as possible consistent with the error limitations imposed upon the amplifier.

Figures 4, 5:
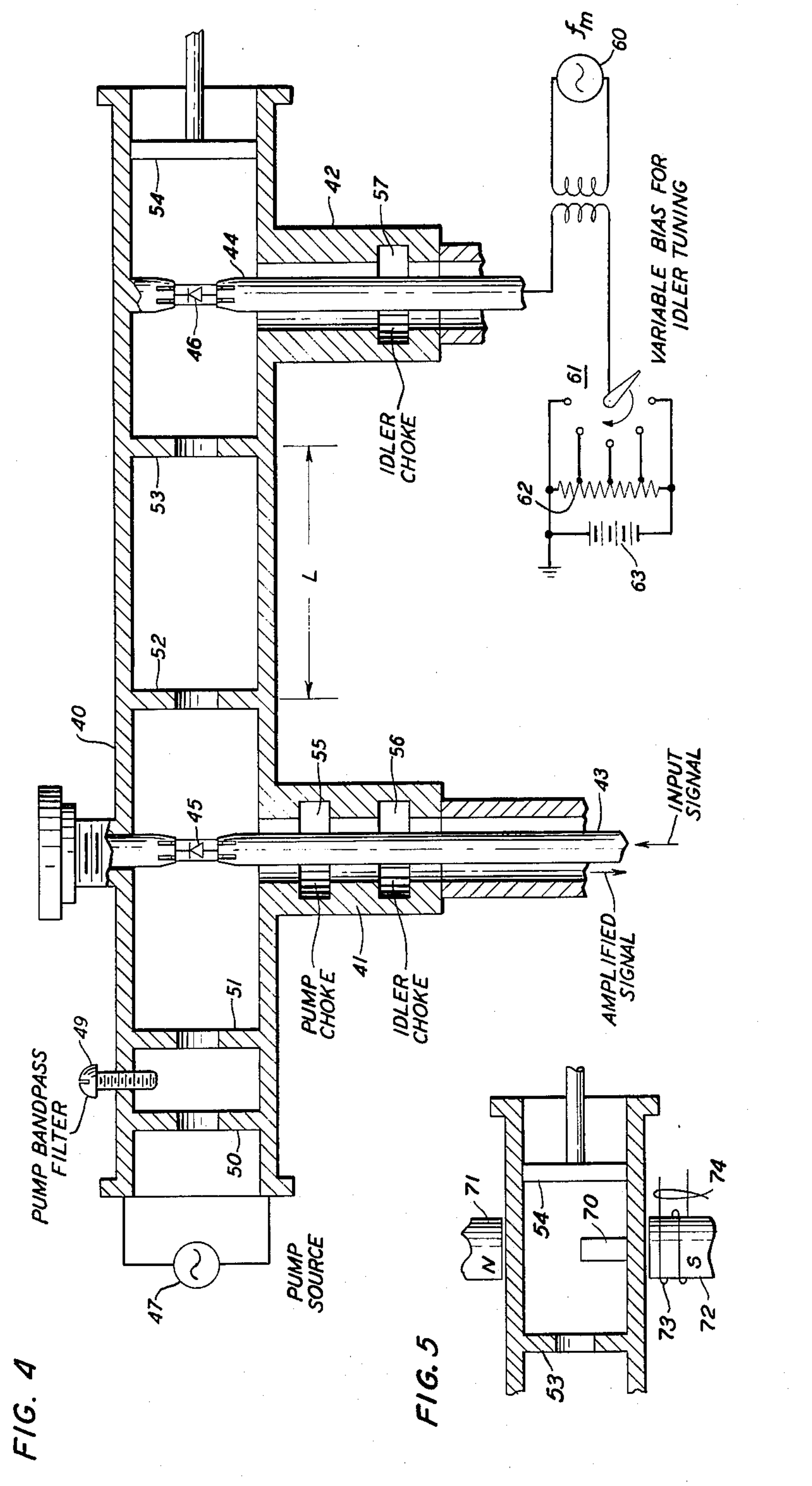
FIG. 4 shows an illustrative embodiment of the invention.
FIG. 5 shows the use of a gyromagnetic element as the idler tuning reactance.

FIG. 4, shown in cross-sectional view, is an illustrative embodiment of the invention. The amplifier includes two diode mounts. The first mount, containing the amplifying diode, is a typical nondegenerate amplifier of the type shown on page 209 of the February 1962 issue of the Proceedings of the Institute of Radio Engineers. The second mount, which contains the idler tuning diode, is similar but without pump and signal circuits. The idler circuits of these two mounts are separately tunable at the appropriate idler frequency and coupled through a section of transmission line of appropriate length.

Referring more specifically to FIG. 4, the amplifier comprises a section of rectangular waveguide 40 intersected by means of a pair of coaxial lines 41 and 42. Waveguide 40 is preferably supportive of wave energy at the pump frequency and at the idler frequency but cut-off for wave energy at the signal frequency. In the embodiment of FIG. 4, the coaxial lines abut upon the lower wide wall of guide 40. Inner conductors 43 and 44 extended up through guide 40 in a direction parallel to the narrow dimension thereof and terminate on the upper wide wall.

A first diode 45 inserted in series with conductor 43 is the so-called "amplifier" diode. A second diode 46 inserted in series with conductor 44 is the so-called "idler tuning" diode.

Located within guide 40 are a number of electrical discontinuities 50, 51, 52, 53, tuning screw 49, and a shortening piston 54. These, along with coaxial line radial chokes 55 and 56 in line 41 and choke 57 in line 42 are used to confine the pump, idler and signal frequency wave energy within prescribed regions of the amplifier. In particular, tuning screw 49 and discontinuities 50 and 51 define a pump bandpass filter which passes the pump wave energy but rejects wave energy at the signal and idler frequencies. These, along with discontinuity 52 and the pump choke 55 define a resonant cavity at the pump frequency.

Idler frequency wave energy is confined to the region of the amplifier diode 45 by means of the pump bandpass filter, idler radial choke 56 and discontinuity 52 and to the region of the tuning diode 46 by means of discontinuity 53, idler radial choke 57 and piston 54. These two idler circuits are coupled together through a length L of guide 40. Length L is selected to provide the most suitable impedance transformation.

The inner conductor 43 of line 41 is typically connected through a circulator (not shown) to a signal source and to a signal load in the manner known to workers in the art. Biasing means (not shown) are also provided to provide a suitable bias on diode 45. Tuning means can also be included to broadly tune the signal circuit over the frequency range of interest.

The inner conductor 44 of coaxial line 42 connects to a source of variable bias comprising a rotating switch 61, potentiometer 62 and a constant potential source 63. Switch 61 is provided with a plurality of contacts, each of which connects to a different position on potentiometer 62. Alternatively, an electronic bias control can be used which is capable of faster bias variations. Thus, as explained above, the variable bias source can be controlled by the same means that controls a transmitter's frequency, assuming the amplifier of FIG. 4 is used in conjunction with some sort of frequency jump radar. In addition, a bias modulating source 60 can also be included in the bias circuit for reducing tuning errors as explained hereinabove.

Two amplifiers were constructed in accordance with the invention. The first, operating at a signal frequency of 4 gc. and a pump frequency of 23 gc., had an instantaneous bandwidth of only 15 mc. between half-power points which was effectively increased to 140 mc. by means of idler tuning. Similarly, the effective bandwidth of the second amplifier, operating at a signal frequency of 6 gc., was increased to approximately 200 mc. The instantaneous bandwidth was increased by 100 percent (to 30 mc.) when the idler tuning diode was modulated at 10 kc.

While the invention was described and illustrated utilizing a varactor diode parametric amplifier and a varactor diode as the variable reactance for tuning the idler circuit, it is to be understood that this was not intended to limit the scope and application of the inventive concept. The principles of the invention can be readily applied to parametric amplifiers using gyromagnetic materials as the active element. In addition, the idler frequency tuning element can comprise a suitable inductor, such as a gyromagnetic (i.e., ferrite) material, whose effective inductance can be varied by changing the magnetic biasing field applied to it. Such an arrangement is illustrated in FIG. 5, which shows an external, variably-tuned idler circuit using an element of gyromagnetic material 70 as the tuning element. Tuning element 70 is located in the cavity bounded by discontinuity 53 and shorting piston 54, and replaces diode 46. Element 70 is magnetically biased by means of a constant amplitude magnetic field supplied by some suitable means. In FIG. 5, biasing is supplied by means of a permanent magnet of which the north pole 71 and the south pole 72 are illustrated. Tuning is effected by superimposing a variable magnetic field upon the constant magnetic field. As an example, this can be done by means of a wire coil 73 wound about the permanent magnet and connected by means of leads 74 to a variable biasing circuit. Thus, numerous and varied other arrangements can readily be devised, in accordance with these principles, by those skilled in the art without departing from the spirit and scope of the invention.

What is claimed is:

1. A parametric amplifier having a signal circuit, an idler circuit and a pump circuit;

characterized in that said idler circuit comprises a fixed-tuned circuit electrically coupled to a variably-tuned circuit;

means for tuning said idler circuit comprising a variable capacitance diode coupled to said variably-tuned circuit; and means for changing the bias applied to said diode.

2. In a parametric amplifier having a signal circuit, an idler circuit and a pump circuit;

means for tuning said idler circuit comprising a variable capacitance diode coupled to said idler circuit;

means for changing the bias applied to said diode; and means for modulating the bias appplied to said diode.

3. In a parametric amplifier supportive of wave energy at a signal frequency, an idler frequency and a pump frequency;

characterized in that said idler frequency energy is supported in a network including a fixed-tuned idler circuit and a variably-tuned idler circuit;

means for changing said idler frequency comprising a tunable variable reactance located in said variably-tuned circuit;

means for varying said reactance; and means for coupling wave energy at said idler frequency between said fixed-tuned and said variably-tuned circuit to the exclusion of wave energy at said pump and said signal frequencies.

4. The combination according to claim 3 wherein said variable reactance is a variable capacitance diode.

5. The combination according to claim 3 wherein said variable reactance is an element of gyromagnetic material.

6. A parametric amplifier comprising a wave path supportive of wave energy at a pump frequency $f_p$, and a wave path supportive of wave energy at an idler frequency $f_i$;

means for applying signal wave energy to said amplifier at a signal frequency $f_p - f_i$;

means for varying the frequency of said signal frequency;

means for tracking said amplifier for amplifying said signal frequency comprising a variable reactance coupled to said idler wave path; and means for varying the bias applied to said reactance.

7. A parametric amplifier comprising a plurality of intersecting wave supportive structures including a resonant circuit tuned to the idler frequency of said amplifier;

said resonant circuit included a fixed-tuned circuit and a variably-tuned circuit;

means for varying the resonant frequency of said resonant circuit comprising a variable capacitance diode connected in said variably-tuned circuit;

means for varying the bias applied to said diode; and means for superposing a modulating signal upon said bias.

8. A parametric amplifier for amplifying wave energy at a signal frequency $f_s$ comprising:

a section of rectangular waveguide;

a first coaxial transmission line for introducing wave energy at said signal frequency abutting upon a wide wall of said guide and having its inner coaxial conductor extending transversely across said guide in a direction perpendicular to said wide wall and electrically terminated at the opposite wide wall;

an amplifying varactor diode inserted in series with said conductor within said waveguide;

means for resonating the region of said waveguide which includes said diode at a pumping frequency $f_p$;

a second coaxial transmission line abutting upon said wide wall of said guide at a distance longitudinally displaced from said first coaxial line;

said second coaxial line having its inner conductor extending transversely across said guide in a direction perpendicular to said wide wall and electrically terminated at the opposite wide wall;

a second varactor diode for tuning said amplifier inserted in series with said inner conductor within said waveguide;

means for resonating at an idler frequency $f_p - f_s$ the combined regions of said waveguide which includes said amplifying diode and said second diode;

means for varying the bias applied to said second diode; and means for modulating the bias applied to said second diode.

No references cited.

ROY LAKE, *Primary Examiner.*

D. R. HOSTETTER, *Assistant Examiner.*